(12) United States Patent
Toda

(10) Patent No.: US 6,377,503 B1
(45) Date of Patent: Apr. 23, 2002

(54) SYNCHRONOUS DYNAMIC RANDOM ACCESS MEMORY

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/645,291

(22) Filed: Aug. 24, 2000

Related U.S. Application Data

(62) Division of application No. 09/418,958, filed on Oct. 14, 1999, now Pat. No. 6,144,615, which is a division of application No. 08/997,967, filed on Dec. 24, 1997, now Pat. No. 6,018,491, which is a division of application No. 08/718,786, filed on Sep. 24, 1996, now Pat. No. 5,715,211, which is a division of application No. 08/310,945, filed on Sep. 23, 1994, now Pat. No. 5,596,541.

(30) Foreign Application Priority Data

Sep. 23, 1994 (JP) .............................................. 5-242932

(51) Int. Cl.⁷ ................................................. G11C 8/00
(52) U.S. Cl. ...................... 365/230.03; 365/233; 365/63
(58) Field of Search ............................ 365/230.03, 63, 365/51, 233

(56) References Cited

U.S. PATENT DOCUMENTS

| | | | |
|---|---|---|---|
| 4,630,230 A | 12/1986 | Sundet | 365/189.04 |
| 5,327,390 A | 7/1994 | Takasugi | 365/230 |
| 5,384,745 A | 1/1995 | Konishi et al. | 365/230.03 |
| 5,386,385 A | 1/1995 | Stephens, Jr. | 365/189.05 |
| 5,390,149 A | 2/1995 | Vogley et al. | 365/189.01 |
| 5,404,336 A * | 4/1995 | Imai | 365/233.03 |
| 5,412,613 A * | 5/1995 | Galbi | 365/233.03 |
| 5,446,696 A | 8/1995 | Wone et al. | 365/222 |
| 5,450,364 A | 9/1995 | Stephens, Jr. et al. | 365/222 |
| 5,539,696 A | 7/1996 | Patel | 365/189 |
| 5,587,950 A | 12/1996 | Sawada et al. | 365/201 |
| 5,590,086 A | 12/1996 | Park et al. | |
| 5,594,704 A | 1/1997 | Konishi et al. | 365/233 |
| 5,596,541 A | 1/1997 | Toda | 365/230.03 |
| 5,631,871 A | 5/1997 | Park et al. | |
| 5,703,828 A | 12/1997 | Park et al. | |
| RE35,723 E | 2/1998 | Takasugi | 365/189.05 |
| 5,715,211 A | 2/1998 | Toda | 365/233 |
| 5,835,956 A | 11/1998 | Park et al. | |
| 5,838,990 A | 11/1998 | Park et al. | |

FOREIGN PATENT DOCUMENTS

| | | |
|---|---|---|
| DE | 3727688 | 2/1988 |
| JP | 60-157798 | 8/1985 |
| JP | 06-259370 | 9/1994 |

OTHER PUBLICATIONS

Masao Taguchi, et al., "A 40–ns 64–Mb DRAM with 64–b Parallel Data Bus Architecture,"IEEE Journal of Solid State Circuits, No. 11, pp. 1493–1497, Nov. 26, 1991.

\* cited by examiner

*Primary Examiner*—A. Zarabian
(74) *Attorney, Agent, or Firm*—Hogan & Hartson, L.L.P.

(57) ABSTRACT

A synchronous DRAM has cell arrays arranged in matrix, divided into banks accessed asynchronously, and n bit I/O buses for transferring data among the cell arrays. In the DRAM, the banks are divided into m blocks, the n-bit I/O buses located between adjacent banks, is used for time sharing between adjacent banks in common, the n bit I/O buses, used for time sharing between adjacent banks in common, are grouped into n/m-bit I/O buses, every n/m bits for each block of m blocks of bank, and in each block in each bank, data input/output are carried out between the n/m-bit I/O buses and data bus lines in each block. A synchronous DRAM includes a first and second internal clock systems for controlling a burst data transfer in which a string of burst data being transferred in synchronism with an external clock signal, when one of the internal clock systems is driven, the burst data transfer is commenced immediately by the selected internal clock system.

40 Claims, 14 Drawing Sheets

FIG. 13
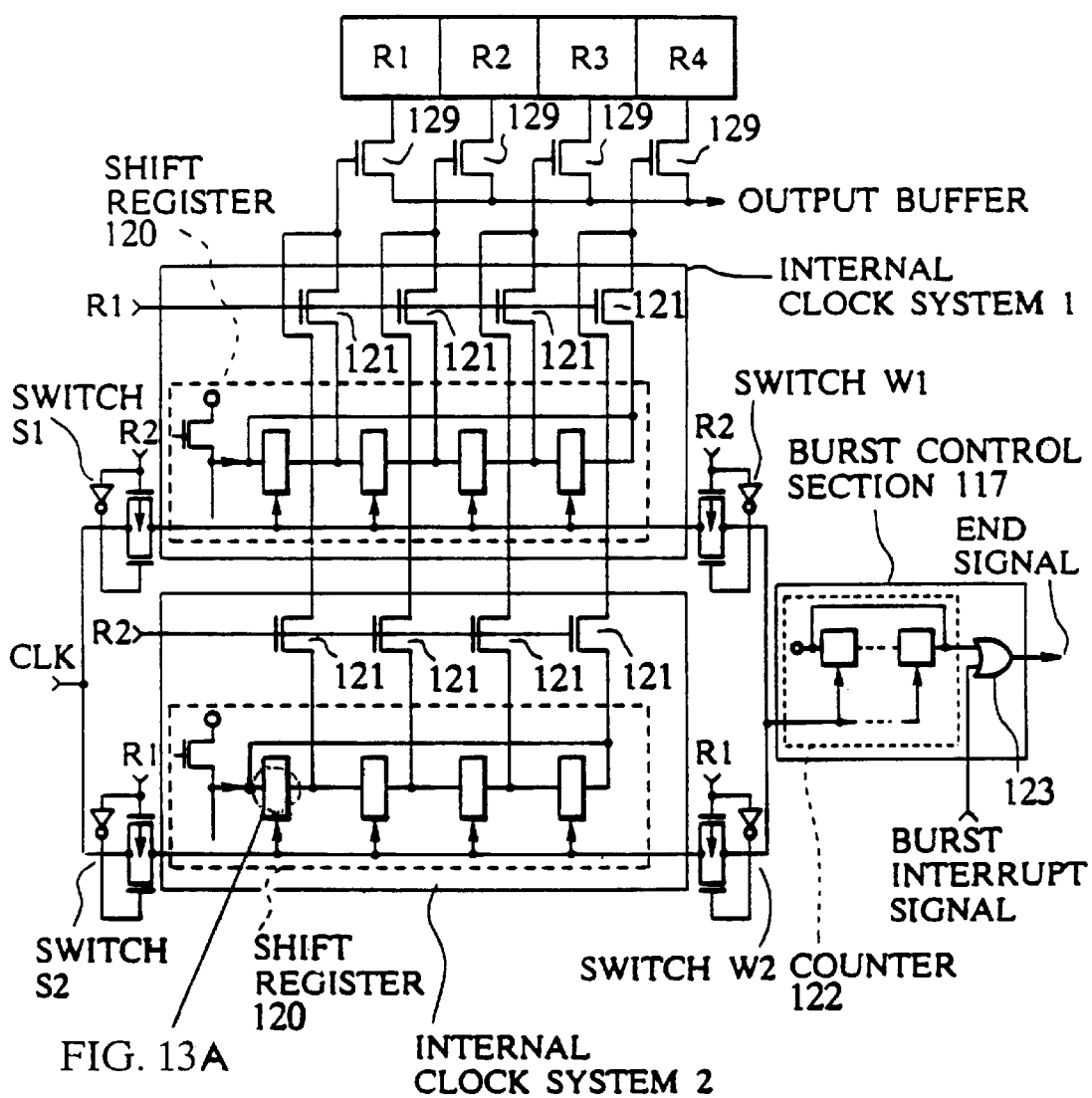
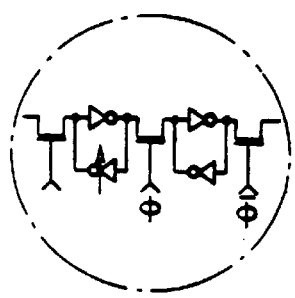
FIG. 13A

SYNCHRONOUS DYNAMIC RANDOM ACCESS MEMORY

This is a division of application Ser. No. 09/418,958, filed Oct. 14, 1999, U.S. Pat. No. 6,144,615 which is a divisional of application Ser. No. 08/997,967,filed Dec. 24, 1997 now U.S. Pat. No. 6,018,491, which is a divisional of application Ser. No. 08/718,786, filed Sep. 24, 1996, now U.S. Pat. No. 5,715,211, which is a divisional of application Ser. No. 08/310,945, filed Sep. 23, 1994, now U.S. Pat. No. 5,596,541, which applications are hereby incorporated by reference in their entirety.

BACKGROUND OF THE INVENTION

1. Field of the Invention

The present invention relates to a synchronous Dynamic Random Access Memory (DRAM) for burst read/write operations.

2. Description of the Prior Art

FIG. 1 shows a conventional dynamic RAM (DRAM) with a conventional basic architectural configuration. FIG. 2 shows a detailed drawing of the conventional DRAM shown in FIG. 1.

In the conventional basic architectural configuration of the dynamic RAM (DRAM), as shown in FIG. 1, data read out of a memory cell selected by a word line is transferred to a sense amplifier (S/A) via a bit line.

A pair of data items amplified by the S/A are read out to an output buffer 104 through a pair of FETs 101 (shown in FIG. 2) through which the pair of data items are controlled by a signal on a column select line CSL.

In the conventional basic architectural configuration of the DRAM shown in FIGS. 1 and 2, we will describe one of architectural configurations of a conventional synchronous DRAM (SDRAM) below.

FIG. 3 shows a path of the synchronous data read/write operations for the input and output of one unit of data. These operations will now be briefly explained.

During the output of one string of serial data, when the head address of the data in the string is provided, two adjacent CSLs corresponding to column select lines CSL1 and CSL2 are selected, and four items of data from memory cells are read out through four pairs of DB lines. This is a 2-bit prefetch system whereby data read out of two columns within two clock cycles simultaneously is transferred serially, and two pairs of DB lines are selected to coincide with serial access addressing from the four pairs of DB lines. This selection is performed by a DB selector. The data on the two pairs of selected DB lines is transferred to two pairs of RWD lines RWD1 and RWD2. Data in the first two cycles on the two pairs of RWD lines are stored into registers R1 and R2, and data in the next two cycles are stored into registers R3 and R4.

In this write operation to the registers R1 to R4, the sequence for storing the data from the RWD lines RWD1 and RWD2 in the registers R1 to R4 is determined by RWD switches RWDS1 and RWDS2.

The data passing through these switches RWDS1 and RWDS2 is stored in access sequence into the registers R1 to R4 by register transfer gates RTG1 and RTG2 which open alternately every two cycles to provide high speed data output.

The RWD switches 1, 2 and the register transfer gates RTG1 and RTG2, as shown in FIG. 3, are made up of gates of FETs. The data stored in the registers R1, R4, for example, as shown in FIG. 4, is read out to the output buffer 104.

FIG. 5 shows a timing chart of the data transfer state in this data read operation described above. In FIG. 5, the data transfer state is illustrated under the condition that the burst length is 8 and the number of latency is 3 counted after address is determined or latched.

In FIG. 5, the operational state of each of the configurational elements shown in FIG. 3 is illustrated. These will now be explained in order.

First, in a clock cycle (CLK), a Column Address Strobe (/CAS) is switched from high to the low, the head address of one string of burst data is set, and access is commenced. After the head address is determined, according to the addressing sequence of the burst data access, an internal address is produced for every two cycles and an access operation is carried out at the rise of levels of every two column select lines CSL.

When the column select line CSL rises, the DB line pair immediately enters to a busy state. When the data has been kept satisfactorily on the DB line pair, using the DB selector, data from two pairs in four-pair DB lines is transferred to the RWD line pair, and the RWD lines enter to the busy state every two cycles.

When data is kept sufficiently on the RWD lines, the data is stored into the register by the operation of one of the register transfer gates RTG1, RTG2 and one of the RWD switches RWD1 and RWD2.

In this data store operation, the RWD switches 1 or 2 are suitably selected by addressing for the burst data and turned ON, normally the register transfer gates 1 and 2 are alternately ON, and the data is stored in the register.

When the respective register transfer gates RTG1 and RTG2 are turned ON, the contents of the register are immediately rewritten and data is transferred serially from an OUTPUT which enters the busy state.

While these burst data transfer are controlled, after the access for the burst data transfer is completed, the clock cycle for commencing a new burst transfer access is restricted because the internal operation is operated in two clock cycles. In other words, a time restriction is produced so that a new access is not commenced from an optional cycle after the burst data transfer is completed. When a new burst data transfer access is commenced from an optional cycle after the previous burst data transfer is completed, it is necessary to temporarily reset the control of the clock period and commence the new burst data transfer after two clock cycles.

For this reason, a data burst completion signal is generated internally at a time when the burst data transfer access is completed and when it becomes unnecessary to control the burst data transfer access. The control system is reset from the clock cycle in which the data burst completion signal is generated. This clock cycle is designated by the reference number CLK9 shown in FIG. 5.

Because if the reset is not completed it is not possible to commence a new burst data transfer cycle and a time period of several tens of ns is required for the reset, the setting of a new starting address for a new burst data transfer occurs from a clock cycle 11. For this reason, it is not possible to set a new burst access in clock cycles CLK9 and CLK10. Accordingly, the output of a new burst data transfer is not possible after the thick dotted line in FIG. 5, so that data output of the new burst data transfer is only possible after the thin dotted line, which is disadvantageous in high speed burst data transfer.

As can be seen from the foregoing description, the reset operation described above is required in a conventional synchronous DRAM during the transfer for a burst data string. Because this reset operation takes a comparatively long time, it is very troublesome to transfer burst data continuously at high speed.

In addition, in a conventional synchronous DRAM, the data transfer system for cell arrays of multibank architectural configuration is not arranged in an optimum manner, necessitating an increase in the area of the chip.

SUMMARY OF THE INVENTION

Accordingly, an object of the present invention is, with due consideration to the drawbacks of such conventional synchronous DRAM, to provide a synchronous DRAM wherein the arrangement of cell arrays with a multibank architectural configuration and a data transfer system is optimized and/or high speed burst data transfer is achieved.

In accordance with one aspect of the present invention, there is provided a synchronous Dynamic Random Access Memory (DRAM) comprising:

a plurality of cell arrays, each of which contains cells, arranged in rows and columns, and being divided into a plurality of banks which being accessed asynchronously; and a plurality of n bit I/O buses for the simultaneous input and output of n bits of data among said plurality of cell arrays, wherein said each bank is divided into m blocks (m is a positive integer) with a plurality of said cell arrays, the n-bit I/O buses (n is a positive integer), located between adjacent banks, is used for time sharing between adjacent banks in common, said n bit I/O buses, used for time sharing between adjacent banks in common, are grouped into n/m bit I/O buses, every n/m bits for each block of m blocks of bank, and in each block in each bank, data input/output are carried out between said n/m-bit I/O buses and data bus lines in each bank.

In the synchronous DRAM described above, said n/m-bit I/O buses are located between adjacent banks.

The synchronous DRAM above, further comprising drive means for driving said cell arrays, wherein a predetermined numbers of said Data Bus (DB) lines are located between adjacent cell arrays, said DB lines are used for time sharing in common by said adjacent cell arrays, and said adjacent cell arrays are driven alternately under the control of said drive means.

In the synchronous DRAM above, n=8 and m=2, a 8 bit I/O bus is provided in common between said adjacent banks, each bank is divided into 2 blocks, and each block uses a 4 bit I/O bus in said 8 bit I/O bus.

In the synchronous DRAM above, n=8 and m=4, a 8 bit I/O bus is provided in common between said adjacent banks, each bank is divided into 4 blocks, and each block uses a 2 bit I/O bus in said 8 bit I/O bus.

In the synchronous DRAM above, further comprises I/O buffers, each corresponds to each of said I/O buses, and said I/O buffer is located adjacent to an I/O pad corresponding to said I/O buffer.

In accordance with another aspect of the present invention, there is provided a synchronous DRAM comprising:

a first internal clock system and a second internal clock system for controlling a burst data transfer in which a string of burst data being transferred in synchronism with an external clock signal, when one of said internal clock systems being driven, the burst data transfer is commenced immediately by said selected internal clock system, wherein when the transfer of a string of burst data is completed under the control of the first internal clock system or when a burst interrupt signal for interrupting the transfer of the string of burst data is input, the first internal clock system enters to a reset state, and the second internal clock system is driven to control the transfer of a string of a next burst data.

In the synchronous DRAM above, further comprises a first internal clock system and a second internal clock system for controlling a burst data transfer in which a string of burst data being transferred in synchronism with an external clock signal, when one of said internal clock systems being driven, the burst data transfer is commenced immediately by said selected internal clock system, wherein when the transfer of a string of burst data is completed under the control of the first internal clock system or when a burst interrupt signal for interrupting the transfer of the string of burst data is received, the first internal clock system enters to a reset state, and the second internal clock system is driven to control the transfer of a string of a next burst data.

BRIEF DESCRIPTION OF THE DRAWINGS

These and other objects, features, and advantages of the present invention will become more apparent from the following description of the preferred embodiments taken in conjunction with the accompanying drawings, in which:

FIG. 13 is a diagram specifically showing one part of the configuration of the second embodiment illustrated in FIG. 12.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Embodiments of the present invention will now be explained with reference to the drawings.

Figure 6:
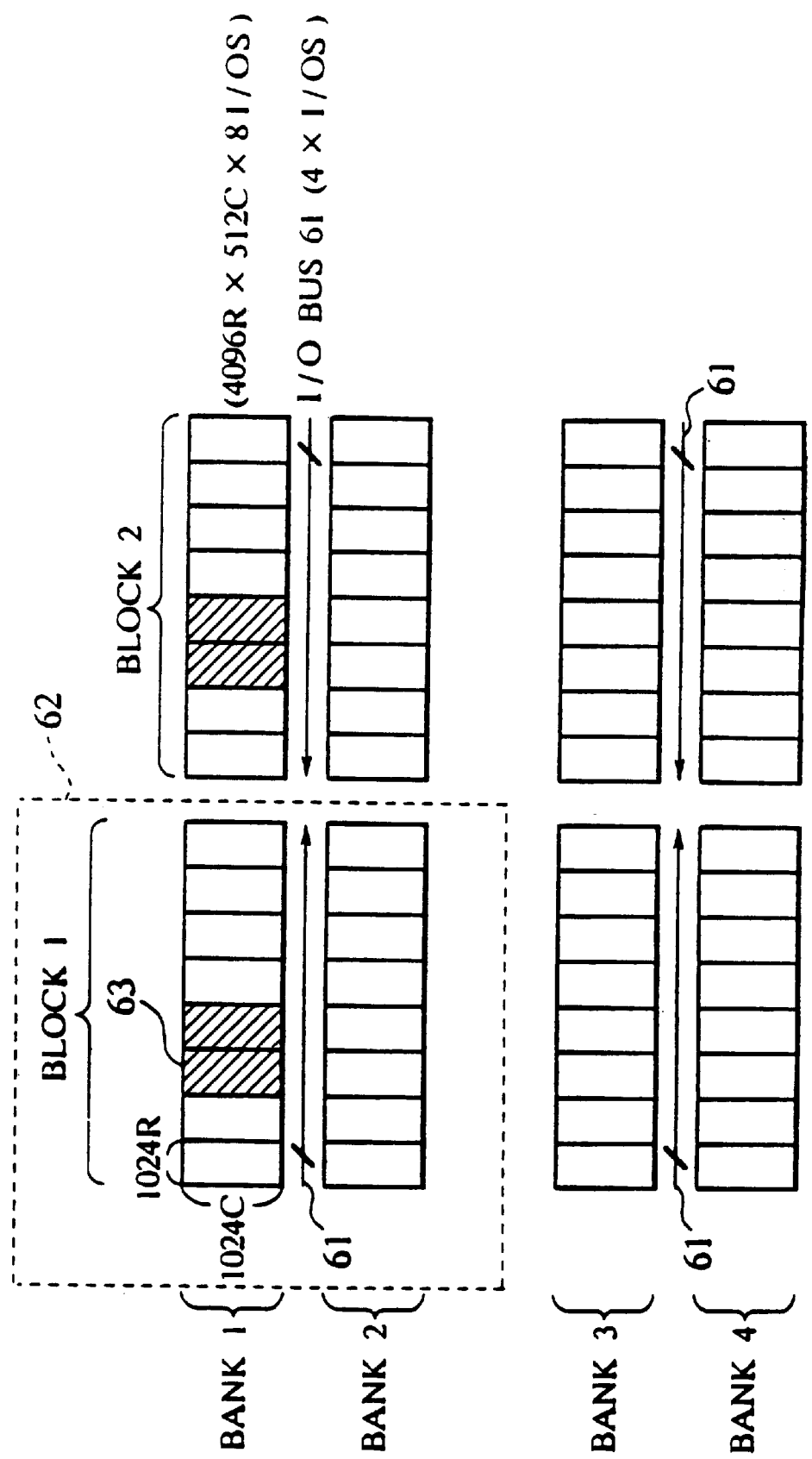
FIG. 6 is a configuration drawing for the first embodiment of a synchronous DRAM of the present invention.

FIG. 6 is an architectural configuration diagram for a first preferred embodiment of a synchronous Dynamic Random Access Memory (synchronous DRAM) of the present invention.

The first embodiment shown in FIG. 6 can basically be considered as a synchronous DRAM with a 64 Mega-bits (64 Mb) structural configuration. The 64 Mb synchronous DRAM shown comprises four banks each of which is 4096 Rows×512 Columns×8 I/Os (2×4 I/Os).

Figure 1:
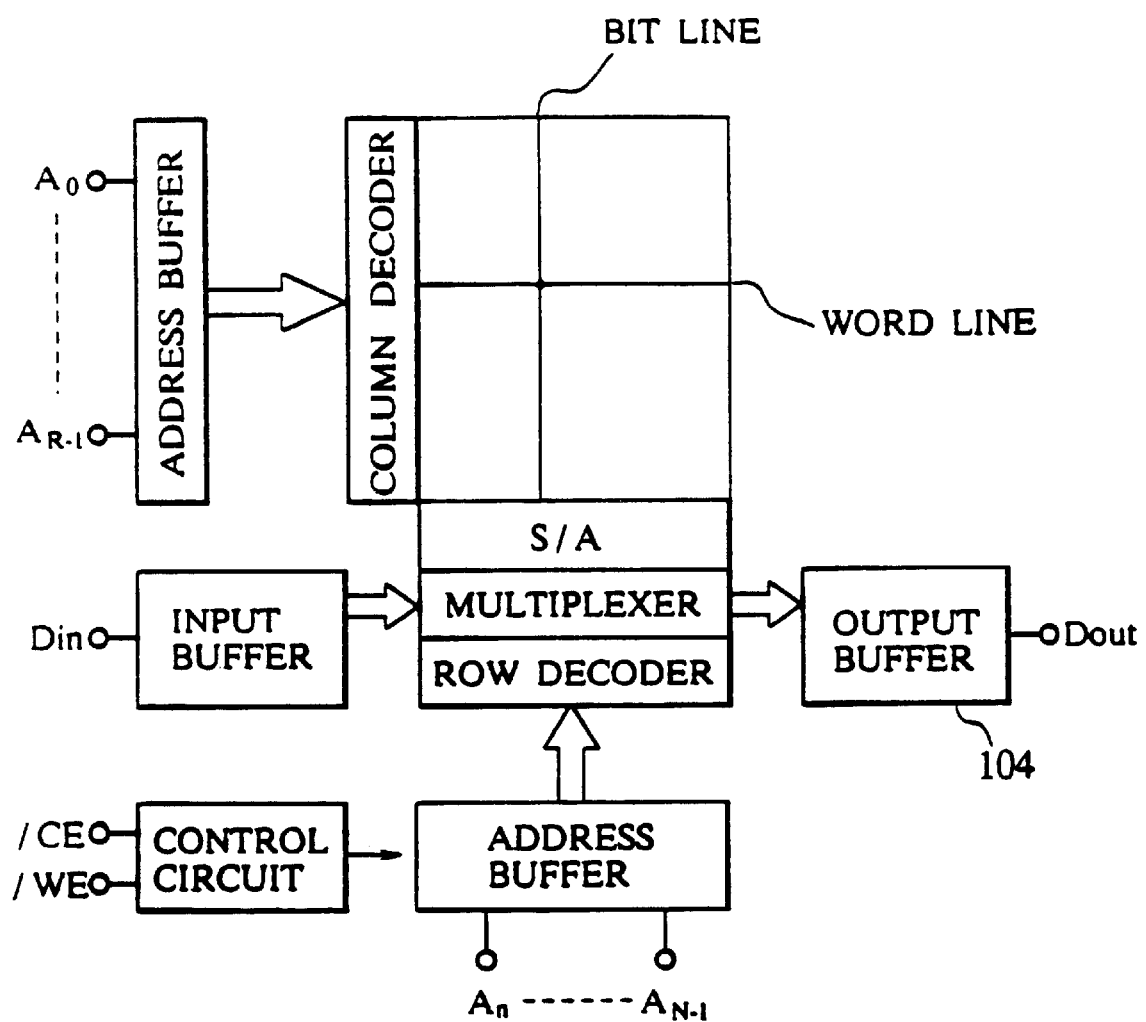
FIG. 1 is a basic configuration drawing for a conventional DRAM.
Figure 2:
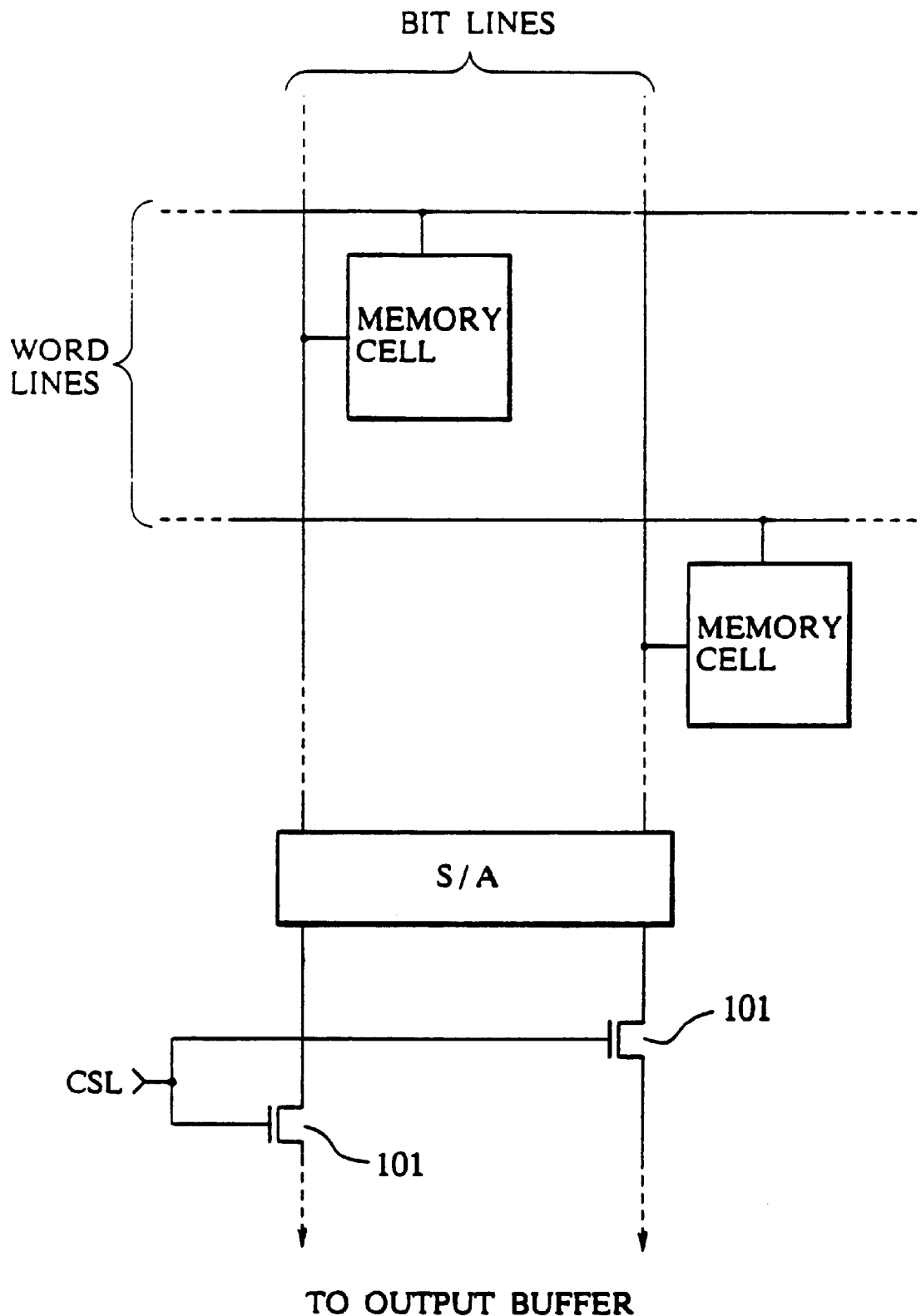
FIG. 2 is a diagram showing one part of the configuration of the conventional DRAM shown in FIG. 1.
Figure 7:
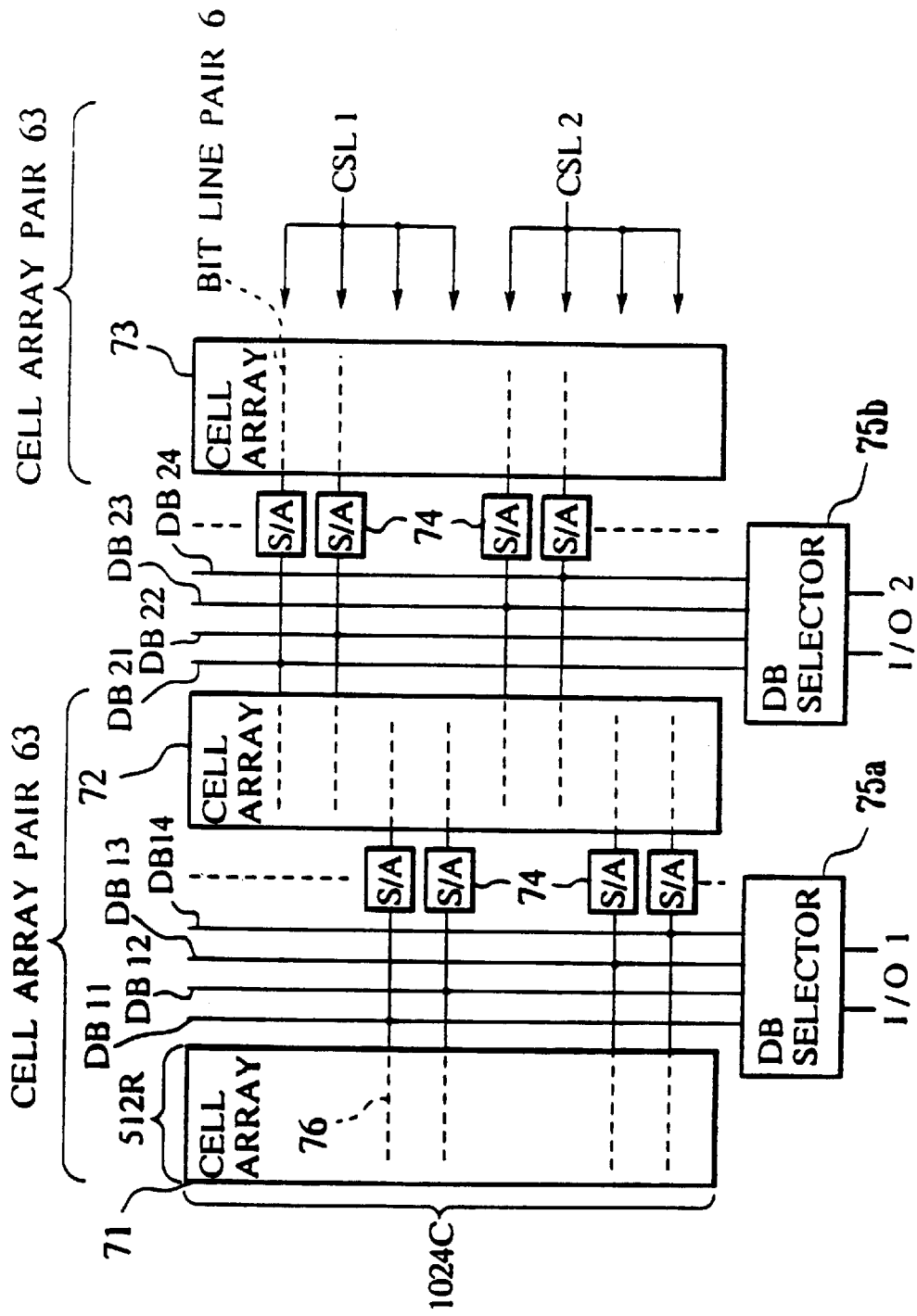
FIG. 7 is a block diagram showing the relationship between cell arrays and data buses in a cell array pair shown in FIG. 6.

Each bank includes two blocks, for example, block 1 and block 2 in the bank 1. Each block comprises eight cell array pairs 63, each of the cell array pair is 1 M bits. In further detail, as shown in FIG. 7, each 1 Mb cell array pair 63 consists of two cell arrays 71 and 72, each of 1024 Columns×512 Rows with sense amplifiers (S/As) incorporated between the two cell array 71 and 72. Each of the blocks in each bank has a data bus 61 for every four I/Os. In this manner, a bank is divided into two blocks with each half corresponding to half of I/Os, so that eight I/Os can be accommodated with a bus for four I/Os, namely for four blocks. This configuration provides a reduction in the chip area because the area of I/O buses 61 is half of the area of the conventional synchronous DRAM shown in FIG. 1.

In addition, when driving the cell arrays, for example, in the case of the bank 1, the 1 Mb cell array pairs 63 indicated by the slanted lines are driven, and each cell array pair 63 uses every two I/Os. Each I/O bus 61 is formed from four I/Os and is provided in common between the adjacent two banks, for example between the bank 1 and the bank 2 or between the bank 3 and the bank 4. This is because data cannot be transferred to two banks at the same time from the specifications of the synchronous DRAM.

Next, the architectural configuration of the data transfer path between the cell array and the I/O bus will be explained.

FIG. 7 is a block diagram showing the detailed configuration of one cell array pair 63 (slanted line-section) as shown in FIG. 6.

In FIG. 7, cell arrays 71, 72, and 73 are made up of 1024 Columns×512 Rows. Sense amplifiers (S/As) 74 are used in common on the two sides of the cell arrays 71 and 72 and perform a sensing operation for bit lines 76 of the cell array 71 or 72 which is driven. The S/A 74 aligned on the two sides of the selected driven cell array, for example, cell array 72 carries out a sensing operation on a bit line of that cell array.

Four pairs of data bus lines DB11, DB12, DB13, DB14 are located between the cell arrays 71 and 72, and four pairs of data bus lines DB21, DB22, DB23, DB24 are provided between the cell arrays 72 and 73. For example, two pairs in the data bus lines DB11, DB12, DB13, and DB14 are selected by a DB selector 75. Data is transferred in the same manner as explained in FIG. 3.

Not shown in FIG. 7, for the connection of bit lines 76 represented by a dotted line and each S/A 74, switch circuits which are cut off as an non-driven cell array is provided between each S/A 74 and each bit line 76.

The bit lines 76 in one cell array are arranged into the right direction and the left direction every two to form different I/Os. As shown in FIG. 7, column select lines CSL1 and CLS2 indicate two adjacent column selector lines selected simultaneously at each clock cycle. By the column select lines CLS1 and CLS2, the two DB lines in the four pair of I/Os which are on the both sides of the cell array 72 are connected to the S/A 4 at a time.

Figure 8:
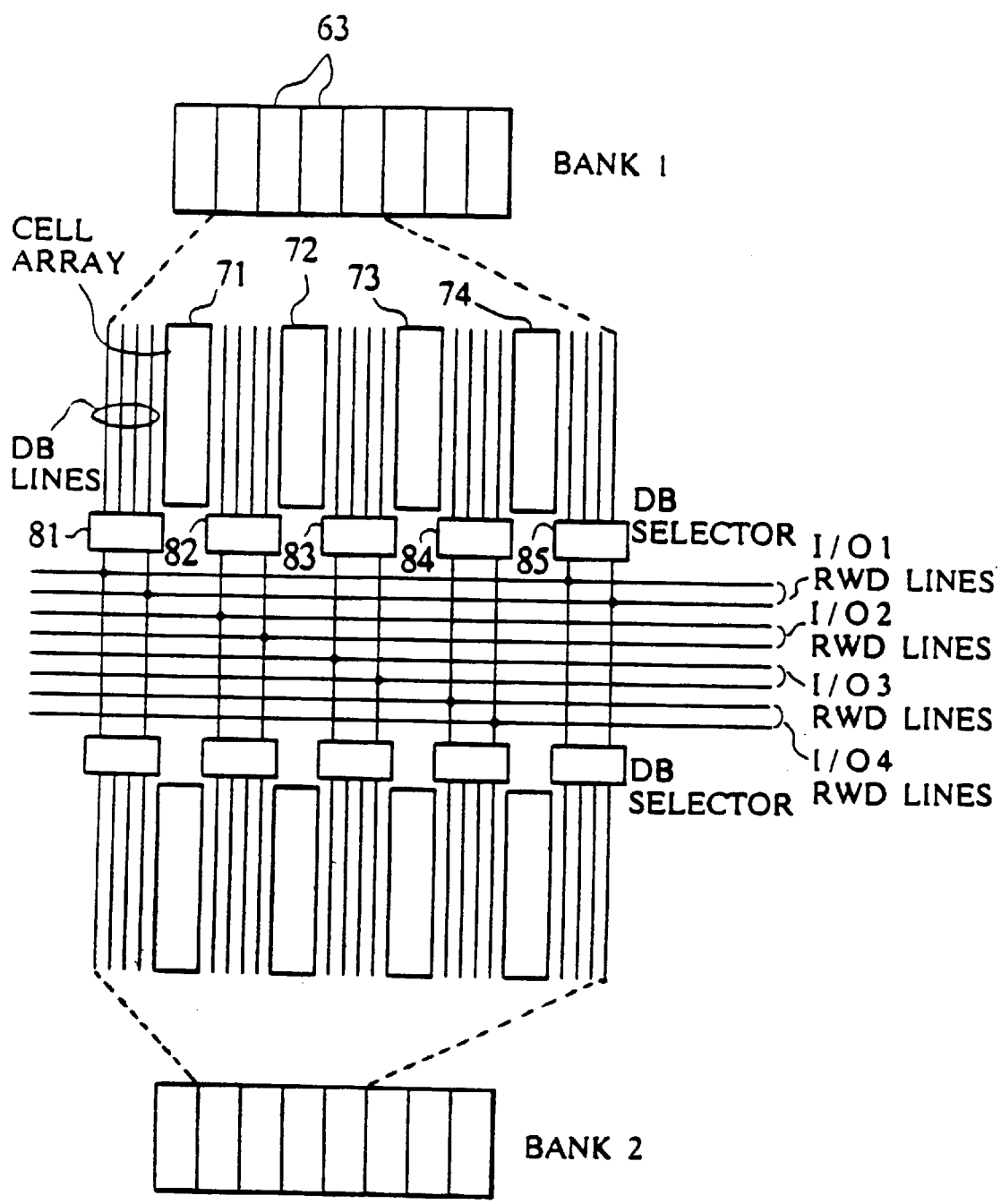
FIG. 8 is a diagram showing the relationship between data transfer paths and banks shown in FIG. 6.

Next, the connection relationship between the I/O1 to I/O4 RWD lines consisting of the I/O buses are shown in FIG. 8. FIG. 8 shows the part 62 enclosed by the dotted line shown in FIG. 6.

FIG. 8 shows the I/O1 RWD lines to the I/O4 RWD line which are the common I/Os for the bank 1 and the bank 2. the cell arrays 63 as the slanted line section in the bank 1 is selectively driven. The enlarged configuration of the cell arrays 63 are shown in detail. Every other one of the two cell arrays are driven. For example, the cell array 71 and 73 shown by the slanted lines are driven. The driven DB selectors 81 to 84 are also indicated by the slanted lines and connected to the I/O1 RWD line to I/O4 RWD line in sequence to the half of the blocks shown in FIG. 8 forming the bank 1. Also, the RWD lines for the I/Os 5, 6, 7, 8 are connected to other half of the blocks for the banks not shown in FIG. 8.

The DB lines are used in common at the both sides of the cell arrays 71 to 74 so that if this type of data transfer path is provided it is possible to assign the address of I/O to each cell array effectively by driving every other one of the cell arrays.

Figure 9:
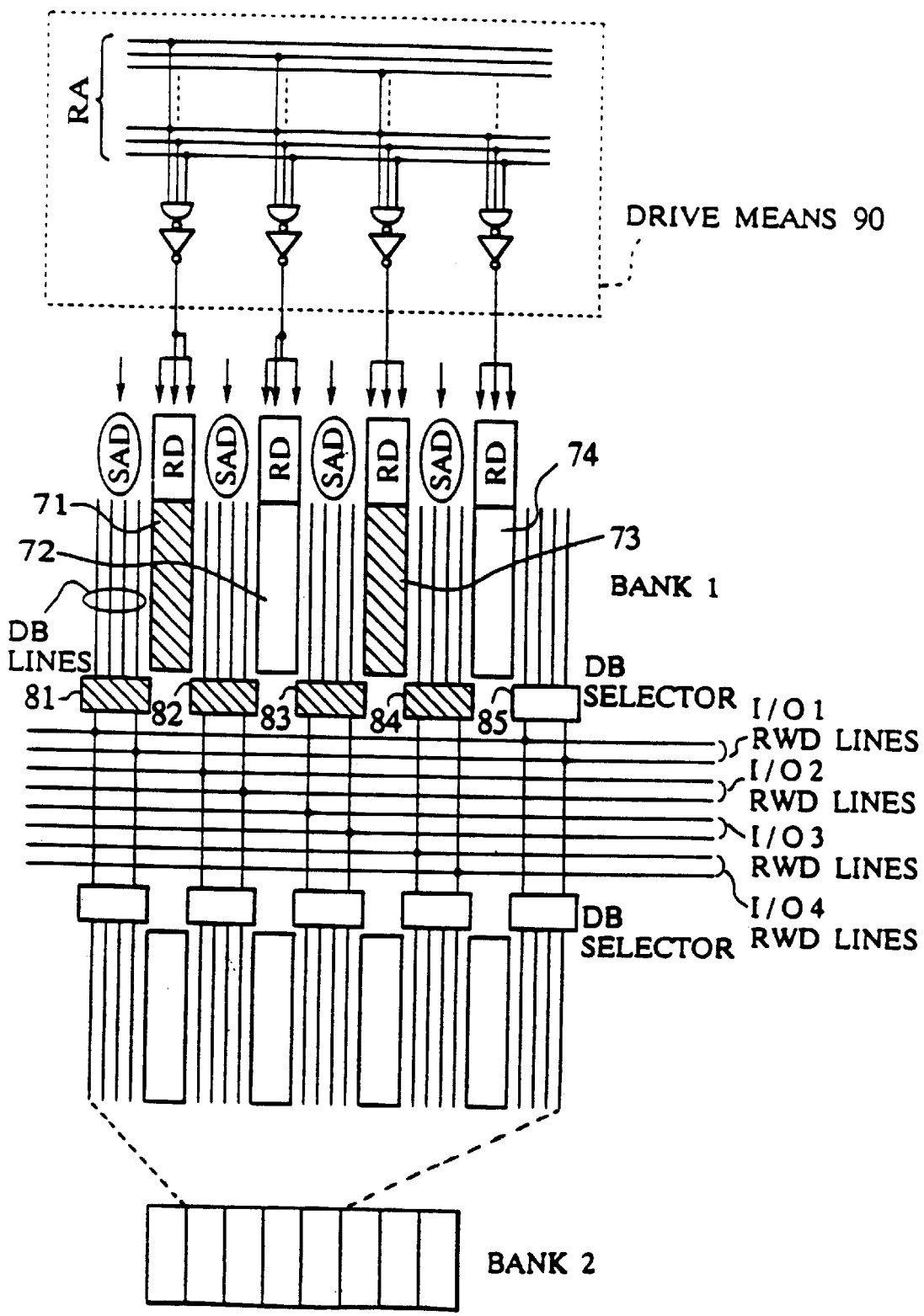
FIG. 9 is a block diagram showing a driver means for driving cell arrays incorporated in the synchronous DAM of the present invention.

FIG. 9 is a block diagram showing a driver means 90 for driving the cell arrays 71 to 74 incorporated in the synchronous DRAM of the first embodiment of the present invention. In FIG. 9, two cell arrays 71 and 73 are driven under the control of the driver means 90. The data from the cell array 71 are transferred to the I/O1 and I/O2 RWD lines through the DB selectors 81 and 82. The data from the cell array 73 are transferred to the I/O3 and I/O4 RWD lines through the DB selectors 83 and 84 (indicated by the slanted lines). Thus, the DB lines are used in common by the adjacent cell arrays. For example, the DB lines connected to the DB selector 82 are used for the cell array 71 and the cell array 72 in common under time-sharing.

Figure 10:
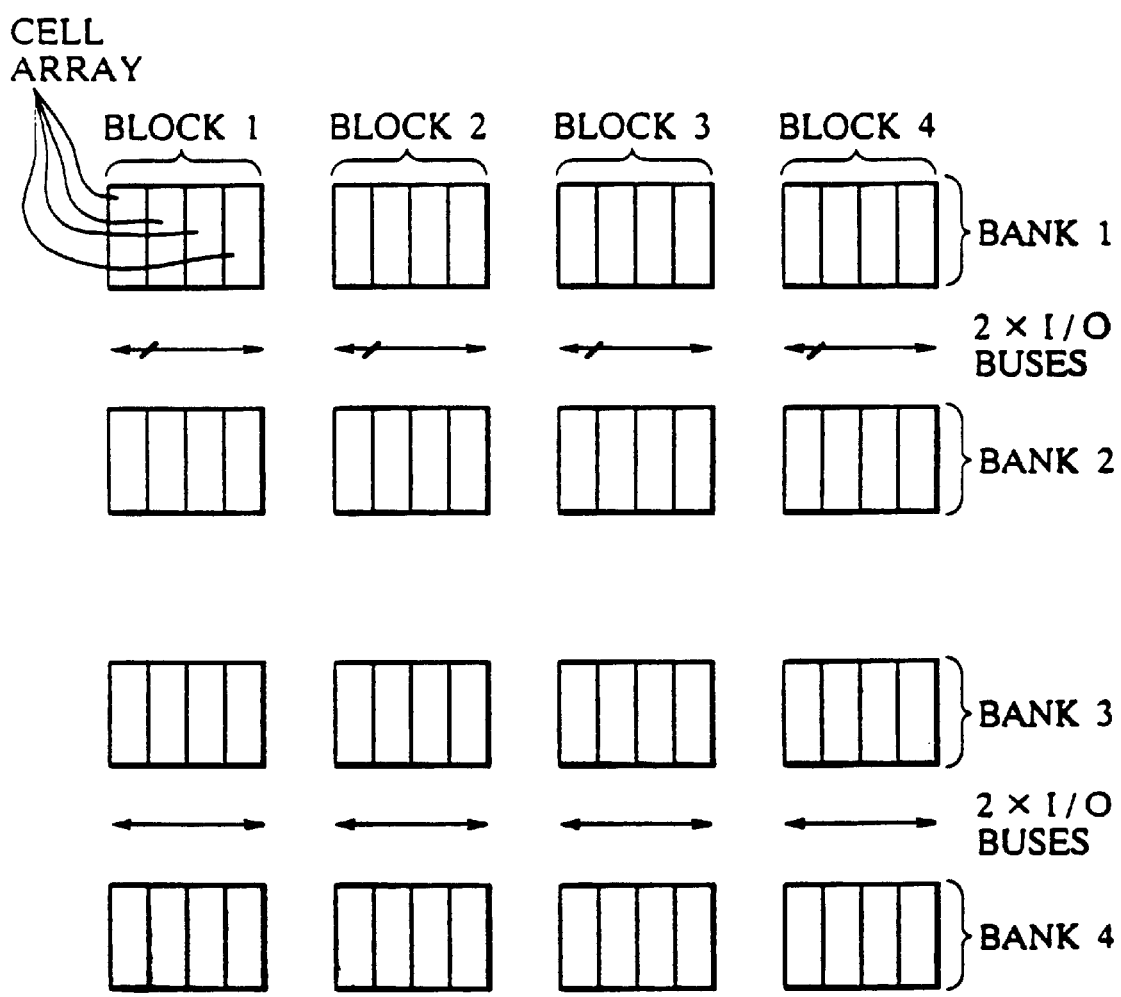
FIG. 10 is another configuration drawing for the first embodiment of a synchronous DRAM of the present invention.

Accordingly, by means of the cell arrays and the data transfer paths with this architectural configuration of the first embodiment of the present invention described above in detail, it is possible to form a large volume synchronous DRAM can be formed because the increase of the system area caused by the data transmission paths can be held to a minimum. Specifically, the architectural configuration of the synchronous DRAM as this embodiment is that each bank is divided into two blocks and the I/O RWD lines assigned in two parts, and the data buses which can be used for time-sharing are separated partially and the data transfer paths in the data buses which can be used for time-sharing between the banks and the like is provided in common with the cell arrays, the banks, and the like, In the first embodiment described above, one bank is divided into two. However, as shown in FIG. 10 for example, one bank may also be divided into four blocks BLOCK1 to BLOCK4 and 2 bit I/O buses can be used for the respective blocks.

Figure 11:
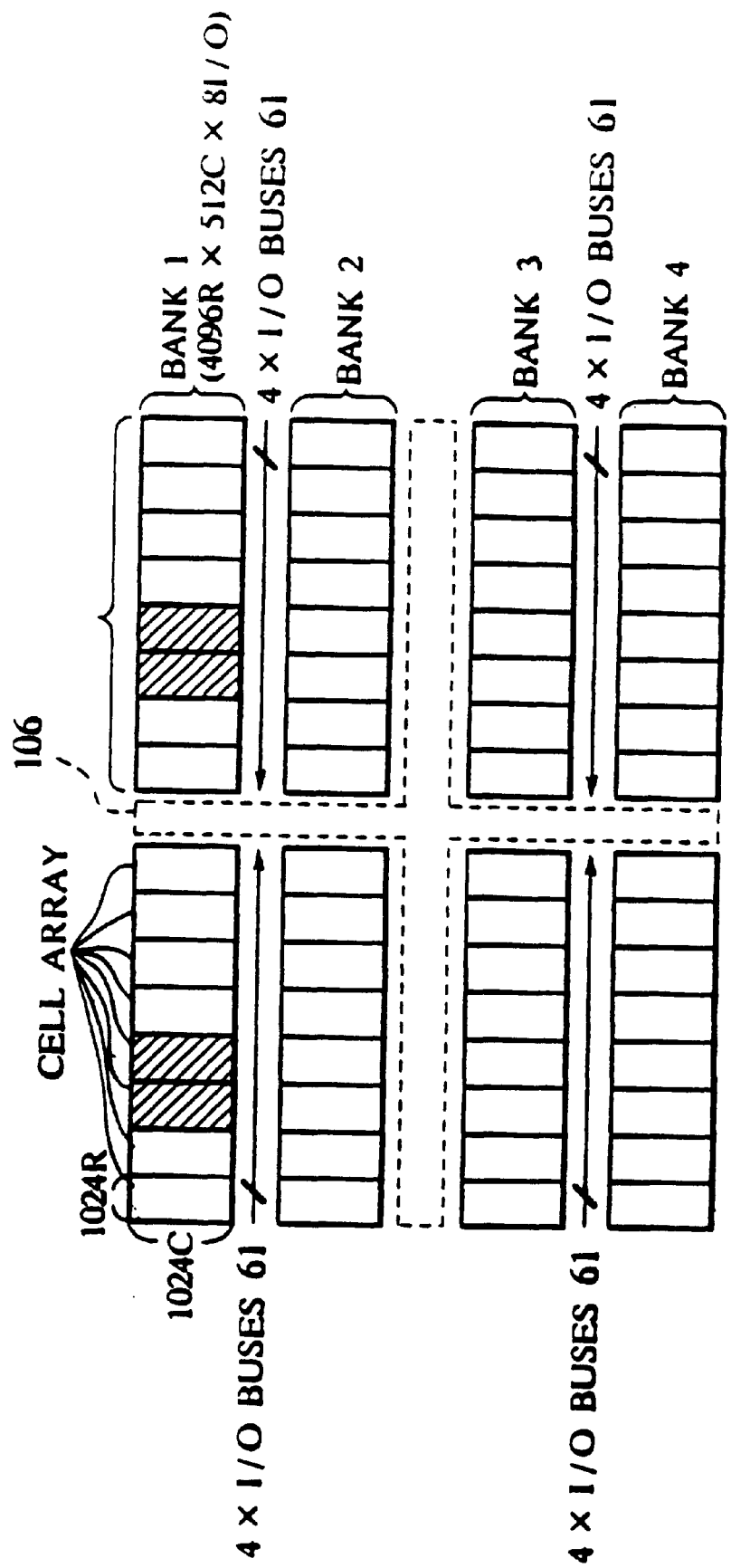
FIG. 11 is a configuration drawing for the relationship between I/O buses and I/O pads in a synchronous DRAM of the present invention.

Also, in the configuration arrangement shown in FIG. 6, if an I/O buffer (omitted from FIGS. 6 and 11) corresponding to the respective I/O buses 61, as shown in FIG. 11, is formed in a layout region 106 (designated by the dotted line) for pads adjacent to an I/O pad (omitted from FIG. 11), the wiring path between the I/O buffer and the I/O pad is short, and it is possible to provide a reduction in the chip area.

Figure 12:
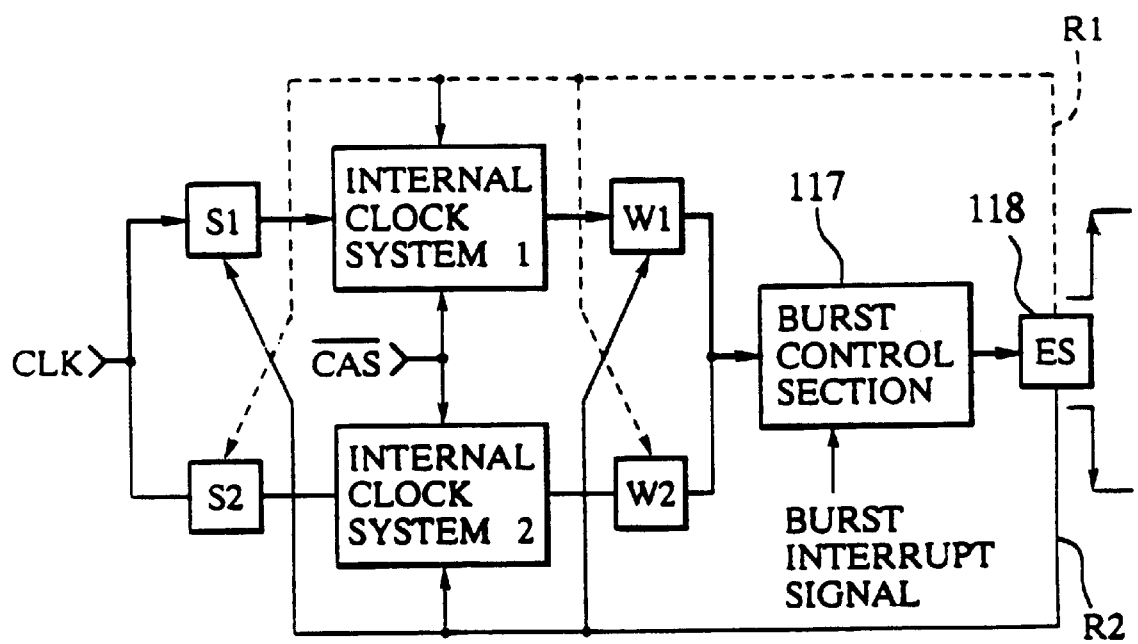
FIG. 12 is a configuration drawing of two internal clock systems in a synchronous DRAM as a second embodiment of the present invention.

FIG. 12 is a view of a second embodiment of the present invention and is a block diagram of a clock system for controlling the internal operation, showing the architecture for alleviating the limitations of the reset explained in the conventional example of an internal clock for controlling the data transfer.

The heavy lines in FIG. 12 show one signal path. When one series of operations is completed for this system, reset and switching signals are transferred to each block as shown by the dotted lines.

Figure 3:
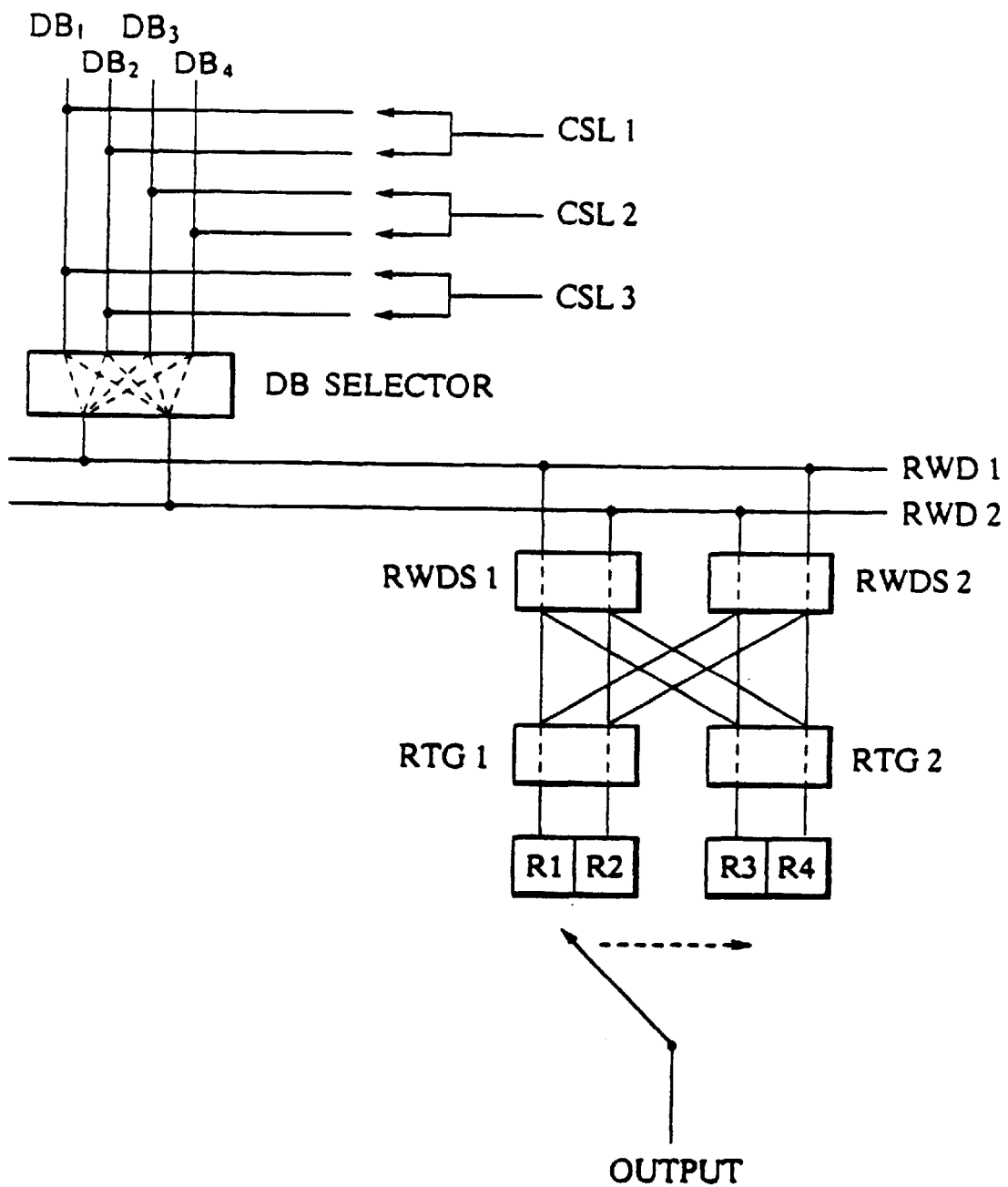
FIG. 3 is a diagram showing one part of the configuration relating to a burst data transfer for a conventional synchronous DRAM.
Figure 4:
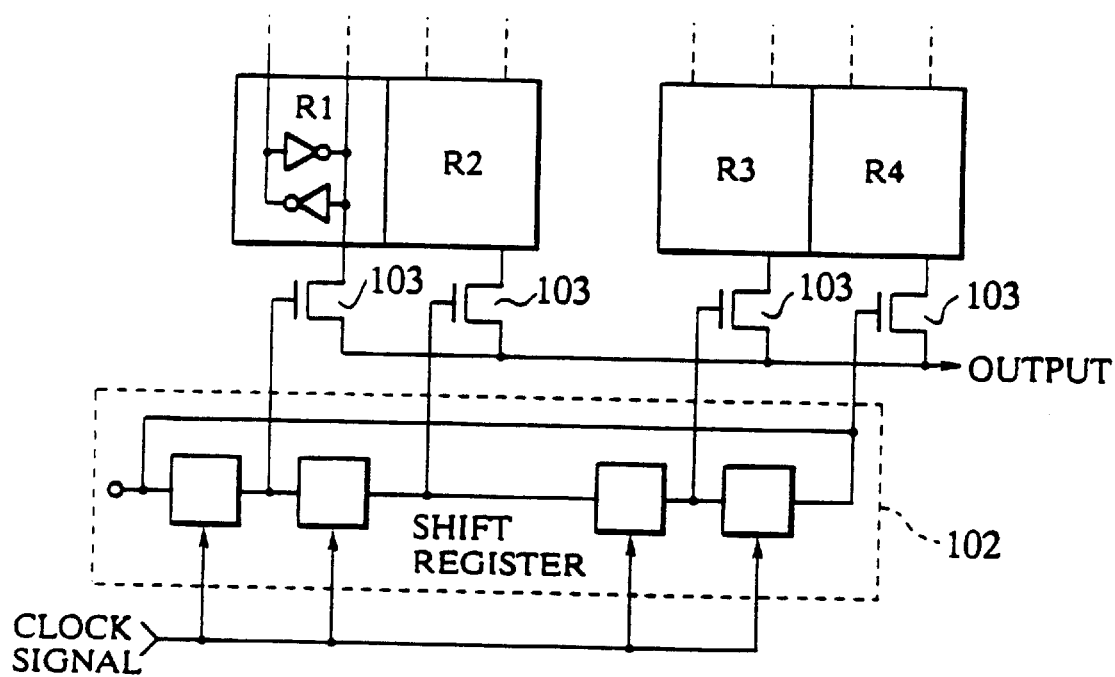
FIG. 4 is a diagram showing one part of the configuration of the synchronous DRAM shown in FIG. 3.
Figure 5:
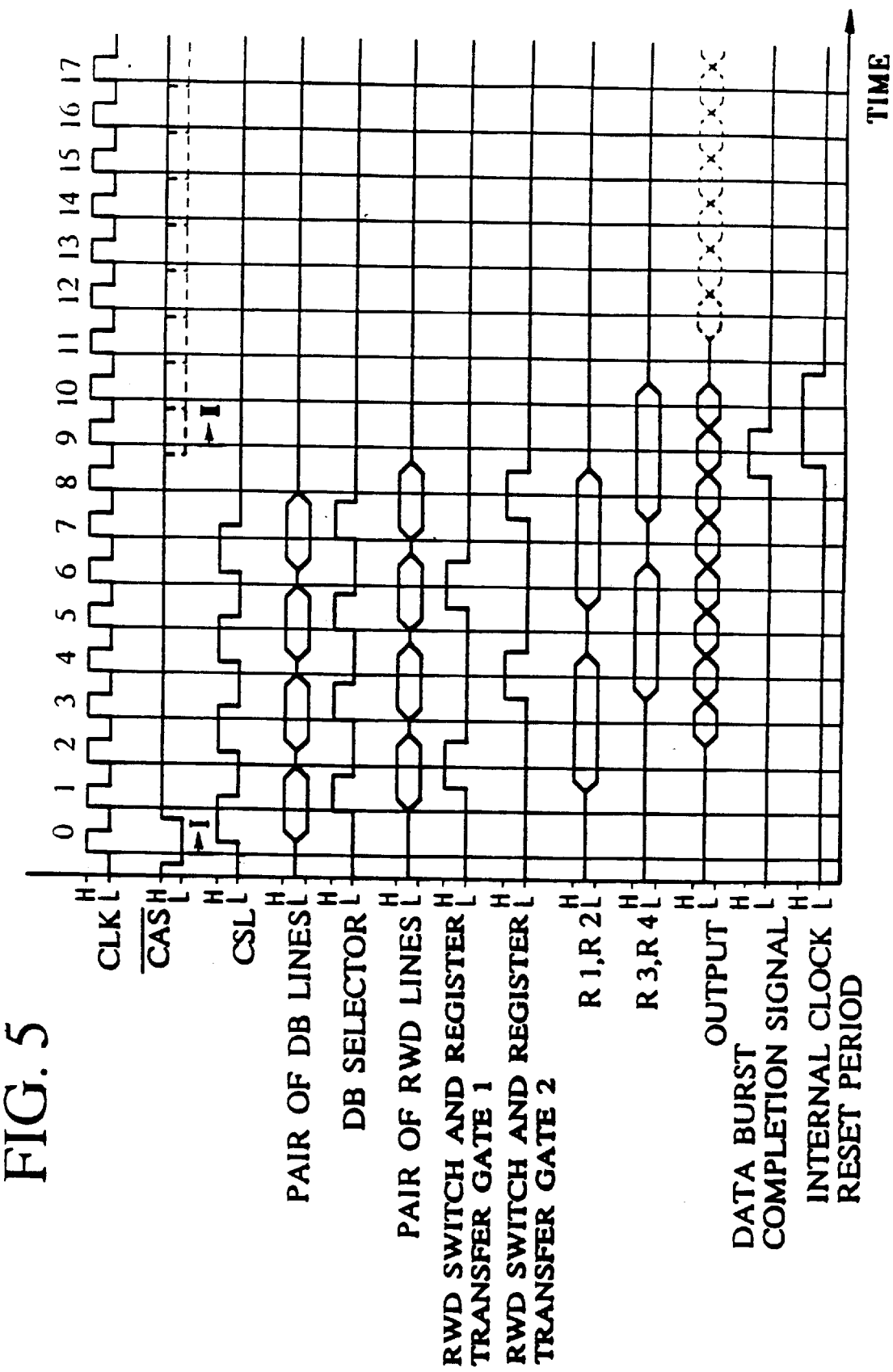
FIG. 5 is a timing chart for the burst data transfer operation of the structure of the synchronous DRAM shown in FIG. 3.

An external clock signal CLK is transferred through a switch S1 to the internal clock system 1 which generates a signal for controlling the output from the registers R1 to R4 shown in FIG. 3. The internal clock system 1 receives an external signal /CAS to generate an internal clock signal for control from the external clock signal CLK. The internal clock signal drives a burst control section 117 for controlling a burst data access through a switch W1.

When one string of burst access is completed under the control of the burst control section 117 or when a burst interrupt signal provided externally is received which halts the burst access in progress, an END signal is transferred to a block ES118 which generates a reset and switching signal from the burst control section 117. The block ES118 outputs a signal R1 or a signal R2 alternately each time the END signal is received. FIG. 13 shows the case where the signal R1 rises. At this time the signal R2 drops. As a result, the switch S1 is OFF, the switch S2 is ON, the internal clock system 1 enters to a reset state and the internal clock system 2 is in the standby state.

Next, when the /CAS signal is received, the internal clock system 2 can operate at any time, in accordance with the external clock signal CLK Also, the switch S1 is OFF and the switch S2 is ON. As a result, the control of the next burst data transfer operation is carried out from the internal clock system 2.

In this manner, the next burst data operation can be performed by using another internal clock system without delaying the completion of the reset of the internal clock system used up to this point, therefore the conventional type of restrictions are not produced. In other word, the time restriction that a new access is commenced from an optional cycle after the previous burst data transfer is completed is not produced in the second embodiment.

The switches S1, S2, W1, W2, the internal clock systems 1 and 2, and the burst control section 117 shown in FIG. 12 are structured, for example, as shown in FIG. 13.

The switches S1, S2, W1, W2 are formed from a complementary FET. The internal block systems 1 and 2 comprise a shift register 120 which generates a control signal for controlling sequentially a transfer gate 129 which controls the output of data from registers R1 to R4, and a transfer gate 121 for selecting control signals for the internal clock system 1 and the internal clock system 2 which are generated by shift registers 120 based on the switching signals R1 or R2 and then providing one of them to the transfer gates 129.

The burst control section 117 comprises a counter 122 for counting the length of one string of a burst data transfer to know the completion of the burst data transfer, and an OR gate 123 which transfer an END signal from the output of the counter 122 or from the input of the burst interrupt signal.

Figure 14:
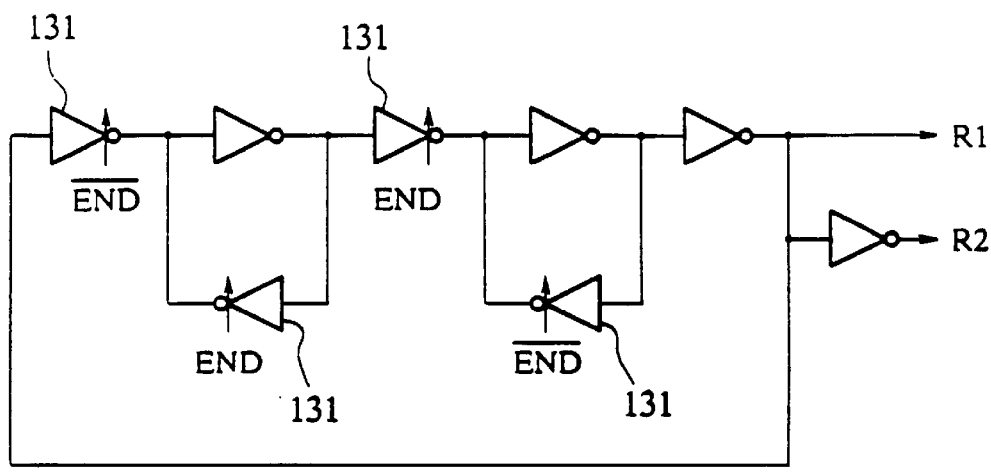
FIG. 14 is a diagram specifically showing one part of the configuration of the embodiment illustrated in FIG. 11.
Figure 15:
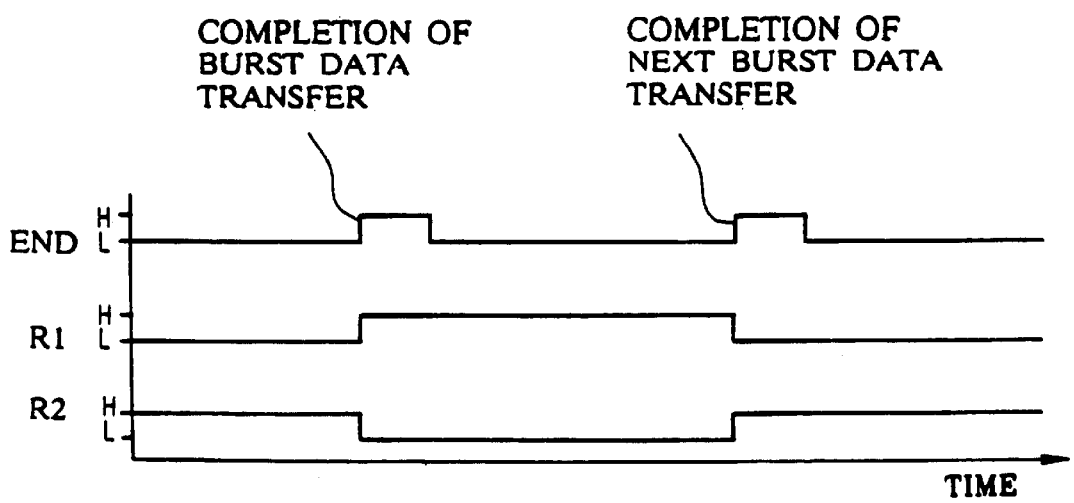
FIG. 15 is an operation timing chart for the structure shown in FIG. 14.

The block ES 118, as shown in FIG. 12, has a configuration, for example, as shown in FIG. 14. Clocked inverters 131 operate as inverters when the END signal and the /END signal rise, and when these signals END and /END fall, the output of the clocked inverters 131 becomes a high impedance. The /END signal is complementary to the END signal, therefore whenever the END signal is in pulse form, the signals R1 and R2 rise alternately as shown in FIG. 15.

In this manner, in the second embodiment described above, by providing two internal clock systems 1 and 2 for controlling the burst data transfer and using these two systems 1 and 2 alternately, it is possible to eliminate restrictions on the burst data transfer because of the time required to reset the clock system. In addition, by combining the second embodiment with the first embodiment having the architectural configuration shown in FIG. 6, the area required in the system can be reduced and therefore the cost is reduced. It is therefore possible to provide a large volume SDRAM combined with the advantage of mitigating the restrictions relating to burst data transfer.

As explained in the foregoing, in the present invention, the banks are divided into a plurality of blocks, the I/O buses are divided to correspond to the various blocks, the I/O buses are used in common between adjacent banks, and the data buses are also used in common between adjacent cell arrays. It is therefore possible to optimize the layout configuration of the cell array and the mechanism of a burst data transfer and to achieve a size reduction of a synchronous DRAM.

In addition, two control systems for controlling the burst data transfer are provided by the present invention, therefore by using the two systems alternately, a reduction in transmission speed is prevented by resetting the burst data burst transfer, and it is possible to achieve high speed data burst transmissions.

While the above provides a full and complete disclosure of the preferred embodiments of the present invention, various modifications, alternate constructions and equivalents any be employed without departing from the true spirit and scope of the invention. Therefore the above description and illustration should not be construed as limiting the scope of the invention, which is defined by the appended claims.

What is claimed is:

1. A synchronous DRAM comprising:
   a first data bus having a plurality of first data line pairs;
   a second data bus having a plurality of second data line pairs;
   a third data bus having a plurality of third data line pairs;
   a fourth data bus having a plurality of fourth data line pairs;
   a fifth data bus having a plurality of fifth data line pairs;
   a first memory cell array arranged between the first and the second data buses, the first memory cell array having a plurality of first bit line pairs connected to a plurality of memory cells in the first memory cell array, the first bit line pairs being selectively connected to the first and second data line pairs;
   a second memory cell array arranged between the second and the third data buses, the second memory cell array having a plurality of second bit lines pairs connected to a plurality of memory cells in the second memory cell array, the second bit line pairs being selectively connected to the second and third data line pairs;

a third memory cell array arranged between the third and the fourth data buses, the third memory cell array having a plurality of third bit line pairs connected to a plurality of memory cells in the third memory cell arrays the third bit line pairs being selectively connected to the third and fourth data line pairs;

a fourth memory cell array arranged between the fourth and the fifth data buses, the fourth memory cell array having a plurality of fourth bit line pairs connected to a plurality of memory cells in the fourth memory cell array, the fourth bit line pairs being selectively connected to the fourth and fish data line pairs;

a sixth data bus having a first I/O line pair, a second I/O line pair, a third I/O line pair, and a fourth I/O line pair;

a first selection circuit provided for the first I/O line pair for selectively connecting the first I/O line pair and one pair from the plurality of first data lines;

a second selection circuit provided for the second I/O line pair for selectively connecting the second I/O line pair and one pair from the plurality of second data lines;

a third selection circuit provided for the third I/O line pair for selectively connecting the third I/O line pair and one pair from the plurality of third data lines;

a fourth selection circuit provided for the fourth I/O line pair for selectively connecting the fourth I/O line pair and one pair from the plurality of fourth data lines; and a fifth selection circuit provided for the fifth I/O line pair for selectively connecting the first I/O line pair and one pair from the plurality of first data lines.

2. The synchronous DRAM according to claim 1 further comprising an activating circuit for simultaneously activating the first and the third memory cell array.

3. The synchronous DRAM according to claim 1 further comprising:

a sixth data bus having a plurality of sixth data line pairs;

a seventh data bus having a plurality of seventh data line pairs;

an eight data bus having a plurality of eighth data line pairs;

a ninth data bus having a plurality of ninth data line pairs;

a tenth data bus having a plurality of tenth data line pairs;

a fifth memory cell array arranged between the sixth and the seventh data buses, the fifth memory cell array having a plurality of fifth bit line pairs connected to a plurality of memory cells in the fifth memory cell array, the fifth bit line pairs being selectively connected to the sixth and seventh data line pairs;

a sixth memory cell array arranged between the seventh and the eighth data buses, the sixth memory cell array having a plurality of sixth bit line pairs connected to a plurality of memory cells in the sixth memory cell array, the sixth bit line pairs being selectively connected to the seventh and eighth data line pairs;

a seventh memory cell array arranged between the eighth and the ninth data buses, the seventh memory cell array having a plurality of seventh bit line pairs connected to a plurality of memory cells in the seventh memory cell array, the seventh bit line pairs being selectively connected to the eighth an the ninth data line pairs;

an eighth memory cell array arranged between the ninth and the tenth data buses, the eighth memory cell array having a plurality of eighth bit line pairs connected to a plurality of memory cells in the eighth memory cell array, the eighth bit line pairs being selectively connected to the ninth and tenth data line pairs;

a sixth selection circuit provided for the first I/O line pair for selectively connecting the first I/O line pair and one pair from the plurality of sixth data lines;

a seventh selection circuit provided for the second I/O line pair for selectively connecting the second I/O line pair and one pair from the plurality of seventh data lines;

an eighth selection circuit provided for the third I/O line pair for selectively connecting the third I/O line pair and one pair from the plurality of eighth data lines;

a ninth selection circuit provided for the fourth I/O line pair for selectively connecting the fourth I/O line pair and one pair from the plurality of ninth data lines;

a tenth selection circuit provided for the first I/O line pair for selectively connecting the first I/O line pair and one pair from the plurality of tenth data lines;

wherein the first to fourth memory cell arrays belong to a first bank and the fifth to eighth memory cell arrays belong to a second bank, and the first bank and the second bank are activated interleavingly.

4. The synchronous DRAM according to claim 1, wherein data read into the first to fourth data buses are transferred to the first to fourth I/O line pairs simultaneously.

5. The synchronous DRAM according to claim 2, wherein data read into the first to fourth data buses are transferred to the first to fourth I/O line pairs simultaneously.

6. The synchronous DRAM according to claim 3, wherein data read into the sixth to ninth data buses are transferred to the first to fourth I/O line pairs simultaneously.

7. The synchronous DRAM according to claim 1, wherein the first and second cell arrays share a first sense amplifier, the second and third cell arrays share a second sense amplifier, and the third and fourth cell arrays share a third sense amplifier.

8. The synchronous DRAM according to claim 2, wherein the first and second cell arrays share a first sense amplifier, the second and third cell arrays share a second sense amplifier, and the third and fourth cell arrays share a third sense amplifier.

9. The synchronous DRAM according to claim 3, wherein the fifth and sixth cell arrays share a fourth sense amplifier, the sixth and seventh cell arrays share a fifth sense amplifier, and the seventh and eighth cell arrays share a sixth sense amplifier.

10. The synchronous DRAM according to claim 1, wherein the first and third memory cell arrays are activated simultaneously, and the second and fourth memory cell arrays are activated simultaneously.

11. The synchronous DRAM according to claim 2, wherein the first and third memory cell arrays are activated simultaneously, and the second and fourth memory cell arrays are activated simultaneously.

12. The synchronous DRAM according to claim 3, wherein the fifth and seventh memory cell arrays are activated simultaneously, and the sixth and eighth memory cell arrays are activated simultaneously.

13. The synchronous DRAM according to claim 3, wherein the first to fourth I/O lines are arranged in such a manner that they pass between the first to fourth memory cell arrays and the fifth to eighth memory cell arrays.

14. The synchronous DRAM according to claim 3, wherein the first to fourth memory cell arrays belong to a first bank and the fifth to eighth memory cell arrays belong to a second bank.

15. The synchronous DRAM according to claim 1, wherein
   data read out from the first memory cell array are transferred to the first and second data buses simultaneously,
   data read out from the second memory cell array are transferred to the second and third data buses simultaneously,
   data read out from the third memory cell array are transferred to the third and fourth data buses simultaneously, and
   data read out from the fourth memory cell array are transferred to the fourth and fifth data buses simultaneously.

16. The synchronous DRAM according to claim 2, wherein
   data read out from the first memory cell array are transferred to the first and second data buses simultaneously,
   data read out from the second memory cell array are transferred to the second and third data buses simultaneously,
   data read out from the third memory cell array are transferred to the third and fourth data buses simultaneously, and
   data read out from the fourth memory cell array are transferred to the fourth and fifth data buses simultaneously.

17. The synchronous DRAM according to claim 3, wherein
   data read out from the fifth memory cell array are transferred to the sixth and seventh data buses simultaneously,
   data read out from the sixth memory cell array are transferred to the seventh and eighth data buses simultaneously,
   data read out from the seventh memory cell array are transferred to the eighth and ninth data buses simultaneously, and
   data read out from the eighth memory cell array are transferred to the ninth and tenth data buses simultaneously.

18. The synchronous DRAM according to claim 4, wherein
   the first and second cell arrays share a first sense amplifier,
   the second and third cell arrays share a second sense amplifier, and
   the third and fourth cell arrays share a third sense amplifier.

19. The synchronous DRAM according to claim 18, wherein the first and third memory cell arrays are activated simultaneously, and the second and fourth memory cell arrays are activated simultaneously.

20. The synchronous DRAM according to claim 19, wherein
   data read out from the first memory cell array are transferred to the first and second data buses simultaneously,
   data read out from the second memory cell array are transferred to the second and third data buses simultaneously,
   data read out from the third memory cell array are transferred to the third and fourth data buses simultaneously, and
   data read out from the fourth memory cell array are transferred to the fourth and fifth data buses simultaneously.

21. A semiconductor memory device comprising:
   a first data bus having a plurality of first data line pairs;
   a second data bus having a plurality of second data line pairs;
   a third data bus having a plurality of third data line pairs;
   a fourth data bus having a plurality of fourth data line pairs;
   a fifth data bus having a plurality of fifth data line pairs;
   a first memory cell array arranged between the first and the second data buses, the first memory cell array having a plurality of first bit line pairs connected to a plurality of memory cells in the first memory cell array, the first bit line pairs being selectively connected to the first and second data line pairs;
   a second memory cell array arranged between the second and the third data buses, the second memory cell array having a plurality of second bit lines pairs connected to a plurality of memory cells in the second memory cell array, the second bit line pairs being selectively connected to the second and third data line pairs;
   a third memory cell array arranged between the third and the fourth data buses, the third memory cell array having a plurality of third bit line pairs connected to a plurality of memory cells in the third memory cell array, the third bit line pairs being selectively connected to the third and fourth data line pairs;
   a fourth memory cell array arranged between the fourth and the fifth data buses, the fourth memory cell array having a plurality of fourth bit line pairs connected to a plurality of memory cells in the fourth memory cell array, the fourth bit line pairs being selectively connected to the fourth and fifth data line pairs;
   a sixth data bus having a first I/O line pair, a second I/O line pair, a third I/O line pair, and a fourth I/O line pair;
   a first selection circuit provided for the first I/O line pair of selectively connecting the first I/O line pair and one pair from the plurality of first data lines;
   a second selection circuit provided for the second I/O line pair for selectively connecting the second I/O line pair and one pair from the plurality of second data lines;
   a third selection circuit provided for the third I/O line pair for selectively connecting the third I/O line pair and one pair from the plurality of third data lines;
   a fourth selection circuit provided for the fourth I/O line pair for selectively connecting the fourth I/O line pair and one pair from the plurality of fourth data lines; and
   a fifth selection circuit provided for the fifth I/O line pair for selectively connecting the first I/O line pair and one pair from the plurality of fifth data lines.

22. The semiconductor memory device according to claim 21 further comprising activating circuit for simultaneously activating the first and the third memory cell array.

23. A semiconductor memory device according to claim 21 further comprising:
   a sixth data bus having a plurality of sixth data line pairs;
   a seventh data bus having a plurality of seventh data line pairs;
   an eight data bus having a plurality of eighth data line pairs;
   a ninth data bus having a plurality of ninth data line pairs;
   a tenth data bus having a plurality of tenth data line pairs;
   a fifth memory cell array arranged between the sixth and the seventh data buses, the fifth memory cell array having a plurality of fifth bit line pairs connected to a plurality of memory cells in the fifth memory cell array, the fifth bit line pairs being selectively connected to the sixth and seventh data line pairs;

a sixth memory cell array arranged between the seventh and the eighth data buses, the sixth memory cell array having a plurality of sixth bit lines pairs connected to a plurality of memory cells in the sixth memory cell array, the sixth bit line pairs being selectively connected to the seventh and eighth data line pairs;

a seventh memory cell array arranged between the eighth and the ninth data buses, the seventh memory cell array having a plurality of seventh bit line pairs connected to a plurality of memory cells in the seventh memory cell array, the seventh bit line pairs being selectively connected to the eighth and the ninth data line pairs;

a eighth memory cell array arranged between the ninth and the tenth data buses, the eighth memory cell array having a plurality of eighth bit line pairs connected to a plurality of memory cells in the eighth memory cell array, the eighth bit line pairs being selectively connected to the ninth and tenth data line pairs;

a sixth selection circuit provided for the first I/O line pair for selectively connecting the first I/O line pair and one pair from the plurality of sixth data lines;

a seventh selection circuit provided for the second I/O line pair of selectively connecting the second I/O line pair and one pair from the plurality of seventh data lines;

an eight selection circuit provided for the third I/O line pair for selectively connecting the third I/O line pair and one pair from the plurality of eighth data lines;

a ninth selection circuit provided for the fourth I/O line pair for selectively connecting the fourth I/O line pair and one pair from the plurality of ninth data lines; and a tenth selection circuit provided for the first I/O line pair for selectively connecting the first I/O line pair and one pair from the plurality of tenth data lines;

wherein the first to fourth memory cell arrays belong to a first bank and the fifth to eighth memory cell arrays belong to a second bank, and the first bank and the second bank are activated interleavingly.

24. The semiconductor memory device according to claim 1, wherein data read into the first to fourth data buses are transferred to the first to fourth I/O line pairs simultaneously.

25. The semiconductor memory device-according to claim 2, wherein data read into the first to fourth data buses are transferred to the first to fourth I/O line pairs simultaneously.

26. The semiconductor memory device according to claim 3, wherein data read into the sixth to ninth data buses are transferred to the first to fourth I/O line pairs simultaneously.

27. The semiconductor memory device according to claim 1, wherein the first and second cell arrays share a first sense amplifier,
the second and third cell arrays share a second sense amplifier, and
the third and fourth cell arrays share a third sense amplifier.

28. The semiconductor memory device according to claim 2, wherein the first and second cell arrays share a first sense amplifier,
the second and third cell arrays share a second sense amplifier, and
the third and fourth cell arrays share a third sense amplifier.

29. The semiconductor memory device according to claim 3, wherein the fifth and sixth cell arrays share a fourth sense amplifier,
the sixth and seventh cell arrays share a fifth sense amplifier, and
the seventh and eighth cell arrays share a sixth sense amplifier.

30. The semiconductor memory device according to claim 1, wherein the first and third memory cell arrays are activated simultaneously, and the second and fourth memory cell arrays are activated simultaneously.

31. The semiconductor memory device according to claim 2, wherein the first and third memory cell arrays are activated simultaneously, and the second and fourth memory cell arrays are activated simultaneously.

32. The semiconductor memory device according to claim 3, wherein the fifth and seventh memory cell arrays are activated simultaneously, and the sixth and eighth memory cell arrays are activated simultaneously.

33. The semiconductor memory device according to claim 3, wherein the first to fourth I/O lines are arranged in such a manner that they pass between the first to fourth memory cell arrays and the fifth to eighth memory cell arrays.

34. The semiconductor memory device according to claim 3, wherein the first to fourth memory cell arrays belong to a first bank and the fifth to eighth memory cell arrays belong to a second bank.

35. The semiconductor memory device according to claim 1, wherein
data read out from the first memory cell array are transferred to the first and second data buses simultaneously,
data read out from the second memory cell array are transferred to the second and third data buses simultaneously,
data read out from the third memory cell array are transferred to the third and fourth data buses simultaneously, and
data read out from the fourth memory cell array are transferred to the fourth and fifth data buses simultaneously.

36. The semiconductor memory device according to claim 2, wherein
data read out from the first memory cell array are transferred to the first and second data buses simultaneously,
data read out from the second memory cell array are transferred to the second and third data buses simultaneously,
data read out from the third memory cell array are transferred to the third and fourth data buses simultaneously, and
data read out from the fourth memory cell array are transferred to the fourth and fifth data buses simultaneously.

37. The semiconductor memory device according to claim 3, wherein
data read out from the fifth memory cell array are transferred to the sixth and seventh data buses simultaneously,
data read out from the sixth memory cell array are transferred to the seventh and eighth data buses simultaneously,
data read out from the seventh memory cell array are transferred to the eighth and ninth data buses simultaneously, and
data read out from the eighth memory cell array are transferred to the ninth and tenth data buses simultaneously.

38. The semiconductor memory device according to claim 4, wherein the first and second cell arrays share a first sense amplifier, the second and third cell arrays share a second sense amplifier, and the third and fourth cell arrays share a third sense amplifier.

39. The semiconductor memory device according to claim 18, wherein the first and third memory cell arrays are activated simultaneously, and the second and fourth memory cell arrays are activated simultaneously.

40. The semiconductor memory device according to claim 19, wherein data read out from the first memory cell array are transferred to the first and second data buses simultaneously, data read out from the second memory cell array are transferred to the second and third data buses simultaneously, data read out from the third memory cell array are transferred to the third and fourth data buses simultaneously, and data read out from the fourth memory cell array are transferred to the fourth and fifth data buses simultaneously.

* * * * *

UNITED STATES PATENT AND TRADEMARK OFFICE
CERTIFICATE OF CORRECTION

PATENT NO. : 6,377,503 B1
DATED : April 23, 2002
INVENTOR(S) : Haruki Toda

It is certified that error appears in the above-identified patent and that said Letters Patent is hereby corrected as shown below:

Title page,
Item [30], Foreign Application Priority Data, change "Sep. 23, 1994" to
-- Sep. 23, 1993 --.

Signed and Sealed this

Tenth Day of September, 2002

Attest:

Attesting Officer

JAMES E. ROGAN
Director of the United States Patent and Trademark Office